United States Patent
Nizenkoff et al.

(10) Patent No.: US 8,356,640 B1
(45) Date of Patent: Jan. 22, 2013

(54) APPARATUSES AND METHODS FOR FABRICATING WIRE CURRENT COLLECTORS AND INTERCONNECTS FOR SOLAR CELLS

(75) Inventors: Erik Nizenkoff, Corralitos, CA (US); John Zevenbergen, Woodway, WA (US); Darin Birtwhistle, San Francisco, CA (US); Michael Hobson, Fremont, CA (US)

(73) Assignee: Mia Solé, Santa Clara, CA (US)

( * ) Notice: Subject to any disclaimer, the term of this patent is extended or adjusted under 35 U.S.C. 154(b) by 464 days.

(21) Appl. No.: 12/687,754

(22) Filed: Jan. 14, 2010

(51) Int. Cl.
*B21F 45/00* (2006.01)
(52) U.S. Cl. ...................... 140/71 R; 140/123
(58) Field of Classification Search .............. 140/1, 34, 140/35, 48, 92.5, 93 R, 102.5, 113, 117, 123, 140/71 R; 72/190
See application file for complete search history.

(56) References Cited

U.S. PATENT DOCUMENTS

| | | | |
|---|---|---|---|
| 3,459,391 A | | 8/1969 | Haynos |
| 3,553,030 A | | 1/1971 | Lebrun |
| 3,561,500 A | * | 2/1971 | Rentz et al. ............ 140/71 R |
| 4,560,498 A | | 12/1985 | Horsma et al. |
| 4,694,117 A | | 9/1987 | Friedrich et al. |
| 5,034,068 A | | 7/1991 | Glenn et al. |
| 5,330,583 A | | 7/1994 | Asai et al. |
| 5,391,235 A | | 2/1995 | Inoue |
| 5,620,528 A | | 4/1997 | Schade et al. |
| 5,626,688 A | | 5/1997 | Probst et al. |
| 6,121,542 A | | 9/2000 | Shiotsuka et al. |
| 6,132,585 A | | 10/2000 | Midorikawa et al. |
| 6,184,458 B1 | | 2/2001 | Murakami et al. |
| 6,479,744 B1 | | 11/2002 | Tsuzuki et al. |
| 6,531,653 B1 | | 3/2003 | Glenn et al. |
| 6,600,100 B2 | | 7/2003 | Ho et al. |
| 7,544,884 B2 | | 6/2009 | Hollars |
| 2002/0166580 A1 | | 11/2002 | Bauman et al. |
| 2004/0069340 A1 | | 4/2004 | Luch |
| 2004/0187917 A1 | | 9/2004 | Pichler |
| 2005/0072461 A1 | | 4/2005 | Kuchinski et al. |
| 2005/0176270 A1 | | 8/2005 | Luch |
| 2006/0032752 A1 | | 2/2006 | Luch |
| 2006/0180195 A1 | | 8/2006 | Luch |
| 2007/0283997 A1 | | 12/2007 | Hachtmann et al. |
| 2008/0053511 A1 | | 3/2008 | Nakamura |
| 2008/0213477 A1 | | 9/2008 | Zindel et al. |
| 2008/0314433 A1 | | 12/2008 | Luch |

(Continued)

FOREIGN PATENT DOCUMENTS

| | | |
|---|---|---|
| CA | 2718518 | 9/2009 |
| DE | 2757301 | 7/1979 |

(Continued)

OTHER PUBLICATIONS

U.S. Appl. No. 12/052,476, Office Action mailed Mar. 16, 2012.

(Continued)

*Primary Examiner* — Debra Sullivan

(57) ABSTRACT

Provided herein are apparatuses for fabricating wire current collector and/or interconnect assemblies for solar cells. In certain embodiments, the wire assemblies include uniformly pitched serpentine wires. According to various embodiments, the apparatuses include opposing re-circulating chain link assemblies having uniformly pitched posts and a wire weaving assembly configured to weave wire around the re-circulating posts. Also provided are methods of fabricating solar cells including the wire assemblies.

16 Claims, 16 Drawing Sheets

U.S. PATENT DOCUMENTS

| | | | |
|---|---|---|---|
| 2009/0199894 | A1 | 8/2009 | Hollars et al. |
| 2009/0235979 | A1 | 9/2009 | Wudu et al. |
| 2010/0043863 | A1 | 2/2010 | Wudu et al. |
| 2010/0108122 | A1 | 5/2010 | Everson et al. |
| 2010/0122730 | A1 | 5/2010 | Corneille et al. |
| 2010/0212733 | A1 | 8/2010 | Schmidt et al. |
| 2011/0197947 | A1 | 8/2011 | Croft et al. |
| 2012/0080079 | A1 | 4/2012 | Corneille et al. |
| 2012/0138117 | A1 | 6/2012 | Krajewski |

FOREIGN PATENT DOCUMENTS

| | | |
|---|---|---|
| EP | 1868250 | 5/2010 |
| JP | 06-021501 | 1/1994 |
| JP | 07-099334 | 4/1995 |
| JP | 09-036404 | 2/1997 |
| JP | 10-093125 | 4/1998 |
| JP | 2006-041351 | 2/2006 |
| KR | 10-0242852 | 2/2000 |
| WO | 2010/056803 | 5/2010 |

OTHER PUBLICATIONS

U.S. Appl. No. 12/052,476, Notice of Allowance mailed Jul. 18, 2012.
U.S. Appl. No. 12/566,555, Office Action mailed Feb. 16, 2012.
U.S. Appl. No. 13/114,999, "Apparatuses and Methods for Fabricating wire Current Collectors and Interconnects for Solar Cells," McKay et al., filed May 24, 2011.
U.S. Appl. No. 12/915,882, Office Action mailed Jul. 20, 2012.
U.S. Appl. No. 12/052,476, "Interconnect assembly", Zerfu et al., filed Mar. 20, 2008.
WO patent application No. PCT/US2009/035486, International Search Report and Written Opinion, mailed Sep. 29, 2009.
U.S. Appl. No. 12/566,555, "Interconnect Assembly", Wudu et al., filed Sep. 24, 2009.
U.S. Appl. No. 12/272,600, "Power-loss-inhibiting current-collector", Corneille et al., filed Nov. 17, 2008.
U.S. Appl. No. 12/837,867, "Transparent conductive film-coated decals for solar cells", Corneille et al., filed Jul. 16, 2010.
U.S. Appl. No. 12/819,124, "Power-loss-inhibiting current collector having transparent current regulator", Corneille et al., filed Jun. 18, 2010.
U.S. Appl. No. 12/843,648, "Temperature resistant current collectors for thin film photovoltaic cells", Alex Austin, filed Jul. 26, 2010.
U.S. Appl. No. PCT/US2009/064125, International Search Report and Written Opinion, mailed May 24, 2010.
U.S. Appl. No. 12/272,600, Office Action mailed Apr. 14, 2011.
U.S. Appl. No. 12/897,162, "Small gauge wire solar cell interconnect", Corneille et al., filed Oct. 4, 2010.
U.S. Appl. No. 12/052,476, Office Action mailed Jan. 21, 2011.
U.S. Appl. No. 12/052,476, Office Action mailed Aug. 3, 2011.
U.S. Appl. No. 12/272,600, Office Action mailed Oct. 18, 2011.
U.S. Appl. No. 12/915,882, "Apparatus and method for securing wire to decal", McKay et al., filed Oct. 29, 2010.
U.S. Appl. No. 13/114,999, "Apparatuses and methods for fabricating wire current collectors and interconnects for solar cells", McKay et al., filed May 24, 2011.
U.S. Appl. No. 13/082,709, "Adhesives for attaching wire network to photovoltaic cells", Todd Krajewski, filed Apr. 8, 2011.
U.S. Appl. No. 13/085,274, "Thermoplastic wire network support for photovoltaic cells", Todd Krajewski, filed Apr. 12, 2011.
U.S. Appl. No. 13/087,724, "Wire network for interconnecting photovoltaic cells", Steven Croft, filed Apr. 15, 2011.
U.S. Appl. No. 13/087,730, "Interconnecting wire network with conductive tab", Steven Croft, filed Apr. 15, 2011.
U.S. Appl. No. 11/451,616, Office Action mailed Sep. 17, 2009.
U.S. Appl. No. 11/451,616, Office Action mailed Apr. 20, 2010.
U.S. Appl. No. 12/951,711, "Photovoltaic Device and Method and System for Making Photovoltaic Device," Austen, filed Nov. 22, 2010.
Untila et al., "19.2% Efficient Bifacial ITO-($P^+Nn^+$)Si-ITO Laminated Grid Cell, $16^{th}$ European Photovoltaic Solar Energy Conference," May 1-5, 2000, Glasgow, UK, pp. 1489-1491.
Richards et al., "Enhancing the efficiency of production CdS/CdTe PV modules by overcoming poor spectral response at short wavelengths via luminescence down-shifting," 2006 IEEE $4^{th}$ World Conference on Photovoltaic Energy Conversion, May 7-12, 2006, 4 pages.

\* cited by examiner

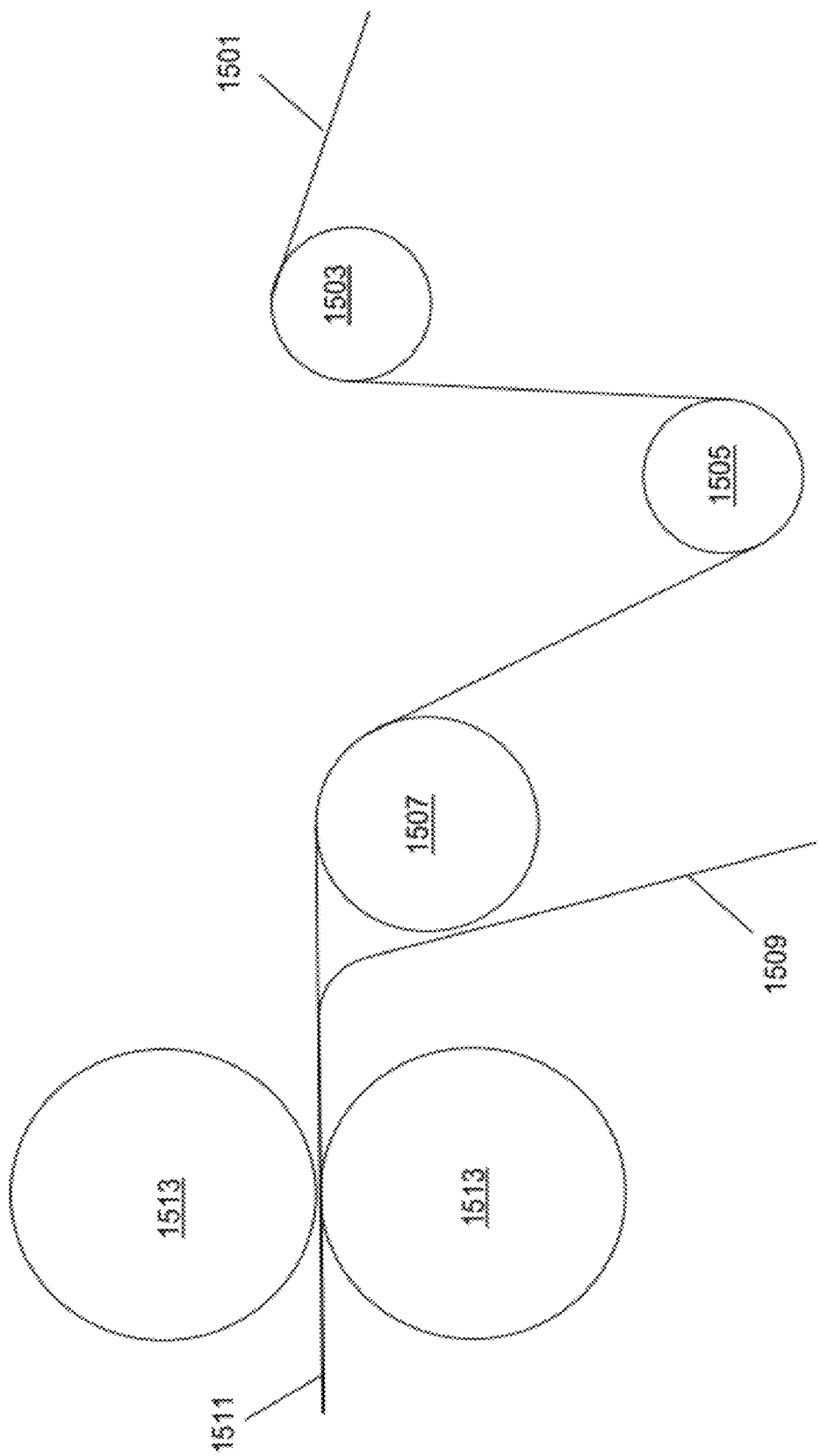

APPARATUSES AND METHODS FOR FABRICATING WIRE CURRENT COLLECTORS AND INTERCONNECTS FOR SOLAR CELLS

BACKGROUND OF THE INVENTION

Photovoltaic cells are widely used for generation of electricity, with multiple photovoltaic cells interconnected in module assemblies. Such modules may in turn be arranged in arrays and integrated into building structures or otherwise assembled to convert solar energy into electricity by the photovoltaic effect. Certain photovoltaic cell fabrication processes involve depositing thin film materials on a substrate to form a light absorbing layer sandwiched between electrical contact layers. The front or top contact is a transparent and conductive layer for current collection and light enhancement, the light absorbing layer is a semiconductor material, and the back contact is a conductive layer to provide electrical current throughout the cell. In one example of a fabrication process, a metallic back electrical contact layer is deposited on a substrate. A p-type semiconductor layer is then deposited on the back contact electrical contact layer and an n-type semiconductor layer is deposited on the p-type semiconductor layer to complete a p-n junction. Any suitable semiconductor materials, such as CIGS, CIS, CdTe, CdS, ZnS, ZnO, amorphous silicon, polycrystalline silicon, etc. may be used for these layers. A top transparent electrode layer is then deposited on the p-n junction. This layer may be a conductive oxide or other conductive film and is used for current collection. Once these or other materials have been deposited on the substrate to form a photovoltaic stack, the substrate and thin film materials deposited on it are cut into cells. Multiple cells are then assembled into a solar module.

SUMMARY OF THE INVENTION

Provided herein are apparatuses for fabricating wire current collector and/or interconnect assemblies for solar cells. In certain embodiments, the wire assemblies include uniformly pitched serpentine wires. According to various embodiments, the apparatuses include opposing re-circulating chain link assemblies having uniformly pitched posts and a wire weaving assembly configured to weave wire around the re-circulating posts. Also provided are methods of fabricating solar cells including the wire assemblies.

These and other aspects of the invention are described further below with reference to the figures.

BRIEF DESCRIPTION OF THE DRAWINGS

FIG. 15 illustrates second decal application according to certain embodiments.

DETAILED DESCRIPTION OF THE PREFERRED EMBODIMENTS

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention. For example, while description below refers chiefly to fabricating wire assemblies used solar cell current collectors and/or interconnects, the apparatuses and methods herein are not so limited and extend to wire assembly fabrication in other fields. In the following description, numerous specific details are set forth in order to provide a thorough understanding of the present invention. The present invention may be practiced without some or all of these specific details. In other instances, well known mechanical apparatuses and/or process operations have not been described in detail in order not to unnecessarily obscure the present invention.

Figure 1:
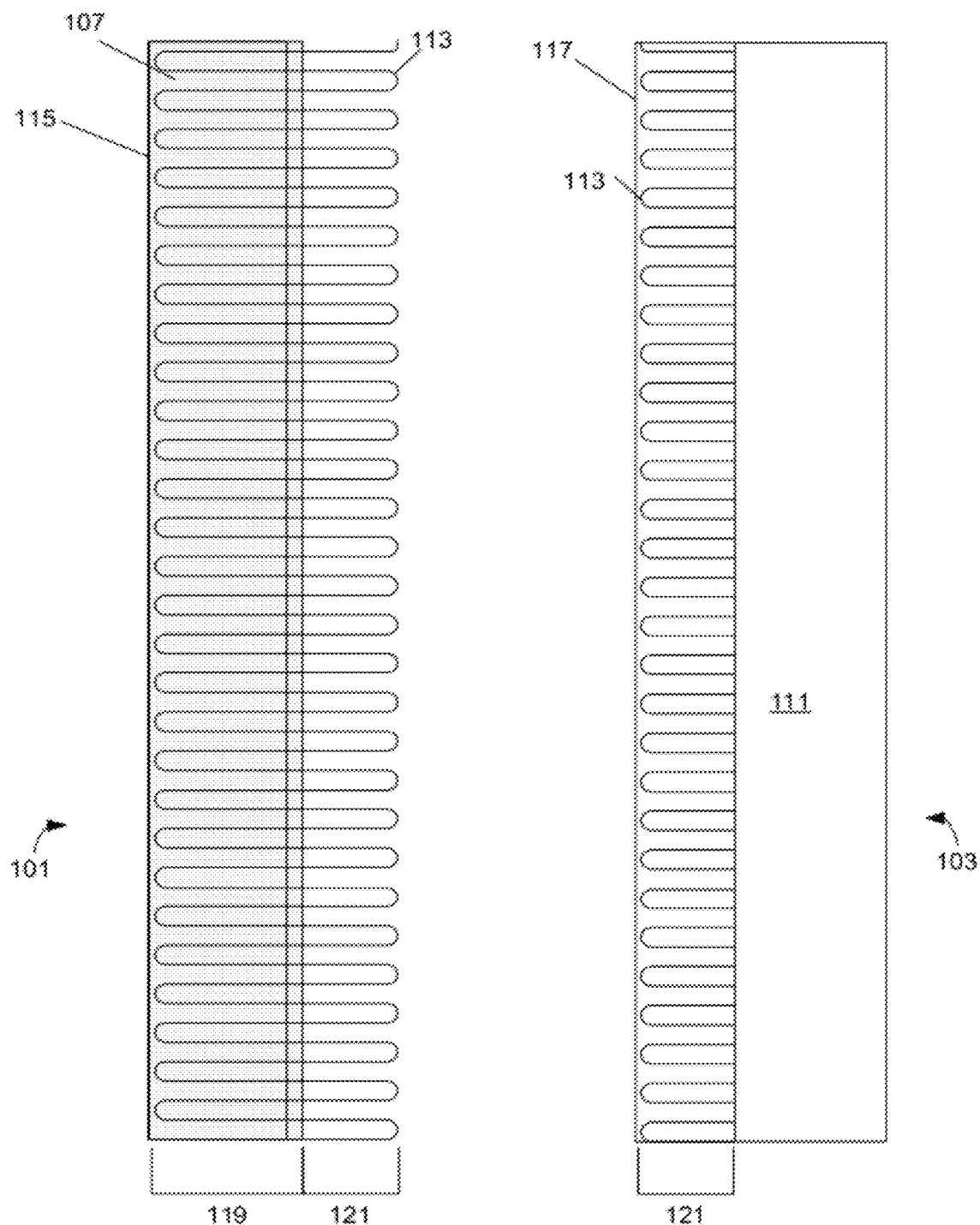
FIG. 1 depicts front and back views of a solar cell including a current collector and interconnect wire according to certain embodiments.
Figure 2:
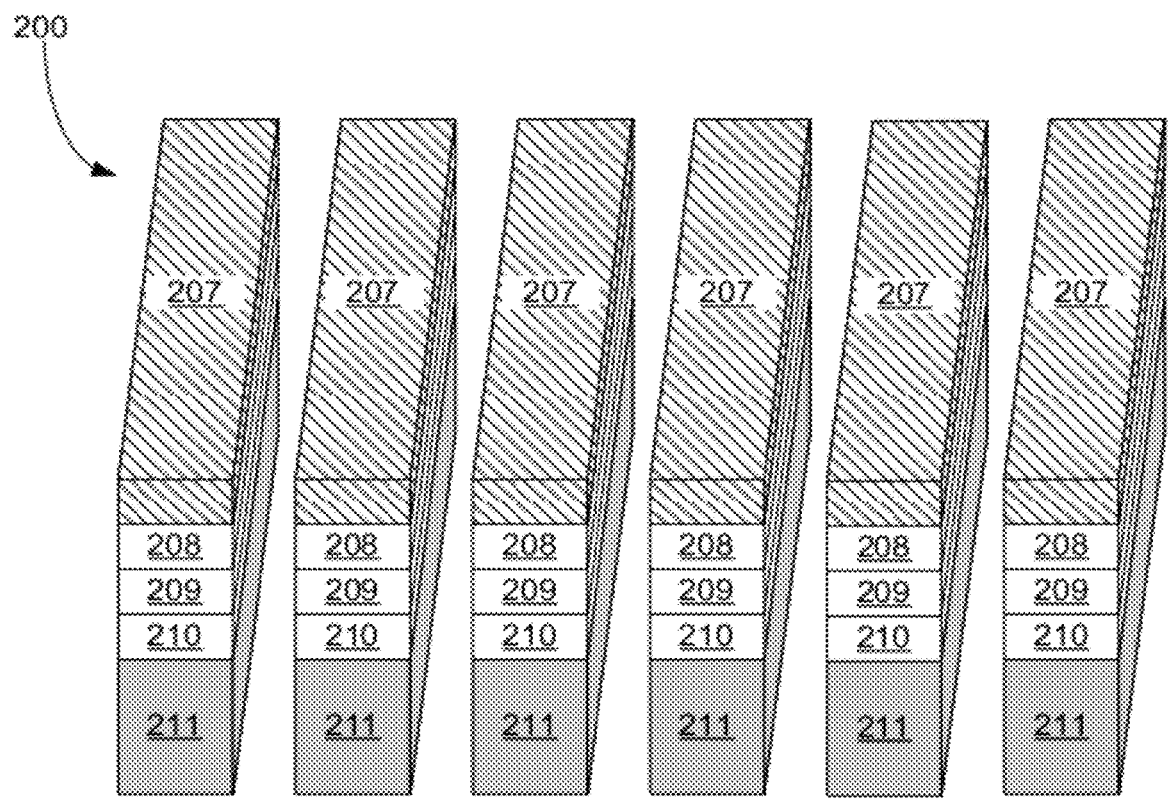
FIG. 2 is a schematic illustration of thin film solar cell stacks according to certain embodiments.

Provided herein are apparatuses and methods for fabricating wire current collectors and interconnects for solar cells. FIG. 1 shows front (101) and back (103) views of a thin film solar cell, including a wire current collector/interconnect assembly. Front view 101 shows the front, or light facing, side of the solar cell including a conductive transparent top layer 107, and back view 103 shows a metallic substrate 111 supporting a thin film solar cell stack. An example of a thin film solar cell stack is depicted in FIG. 2, which shows a perspective view of cell-width strips 200 of thin film solar cell stacks. Substrate 211 supports thin films 210, 209, 208 and 207. Layers 208 and 209 form a p-n junction, with a p-type semiconductor layer 209 deposited on a back electrical contact layer 210 and an n-type semiconductor layer 208 deposited on p-type semiconductor layer 209 to complete a p-n junction. According to various embodiments, any suitable semiconductor materials, such as CIGS, CIS, CdTe, CdS, ZnS, ZnO, amorphous silicon, polycrystalline silicon, etc. are used for layers 208 and 209. For example, the p-type semiconductor layer 209 may be CIGS or CIS, and the n-type semiconductor layer 208 may be CdS or a cadmium free material, such as ZnS, ZnO, etc. Top electrode layer 207 overlays the p-n junction. It is transparent, allowing light to reach light absorbing layer 209. In certain embodiments, top transparent electrode layer 207 is a transparent conducting oxide (TCO), for example, zinc oxide, aluminum-doped zinc oxide (AZO), indium tin oxide (ITO) and gallium doped zinc oxide. Back electrical contact layer 210 provides electrical contact to allow electrical current to flow through the solar cell, and may be made of any appropriate material, e.g., molybdenum, niobium, copper, silver, etc. As indicated above, in certain embodiments, substrate 211 is a metallic substrate, e.g., a thin stainless steel foil, though it may also be other metals including but not limited to, titanium, copper, aluminum, beryllium and the like. The substrate 211 may be relatively thin, such as for example, less than or equal to about 2-10 mils, though suitable thicknesses may also be used. In many cases the substrate is thin enough to be flexible. As indicated, the stacks 200 shown in FIG. 2 are long cell width strips, which may be cut further to define individual cells as shown in FIG. 1. The thin film solar cells stacks shown in FIG. 2 are provided for context and not intended to be limiting. For example, the wire current collectors and/or interconnects described herein may be used with other types of solar cells as well as in other fields.

Returning to FIG. 1, the wire assembly includes serpentine wire 113 and wire carrier or decals 115 and 117. In the depicted embodiment, wire 113 is configured as a current collector to collect current generated by the solar cell and as a solar cell interconnect to electrically connect the cell to another cell, for example, in a solar module. In other solar cell or module configurations, the wire may be configured only as a current collector or only as an interconnect.

Referring again to front view 101, a portion 119 of wire 113 overlays conductive transparent top layer 107, and collects current generated from the cell. Wire 113 is typically a thin, highly conductive metal wire. Examples of wire metals include copper, aluminum, nickel, chrome or alloys thereof. In some embodiments, a nickel coated copper wire is used. The wire should be able to maintain the serpentine form shown without significant material strain. In certain embodiments wire having a gauge of 24 gauge-56 gauge, or in particular embodiments, 32 gauge-56 gauge, for example 40 gauge-50 gauge. Front decal 115 overlays all or part of portion 119. (Back decal 117, which overlies portion 121 of wire 113, is not shown in this view for clarity). Front decal 115 is a transparent, insulating carrier for the conductive wire. Examples of decal materials include thermoplastic materials such as poly(ethylene terephthalate) (PET), ionomer resins, e.g., Surlyn™, polyamide, polyetheretherketone (PEEK), or combinations of these. In certain embodiments, it may not be used.

Figure 3:
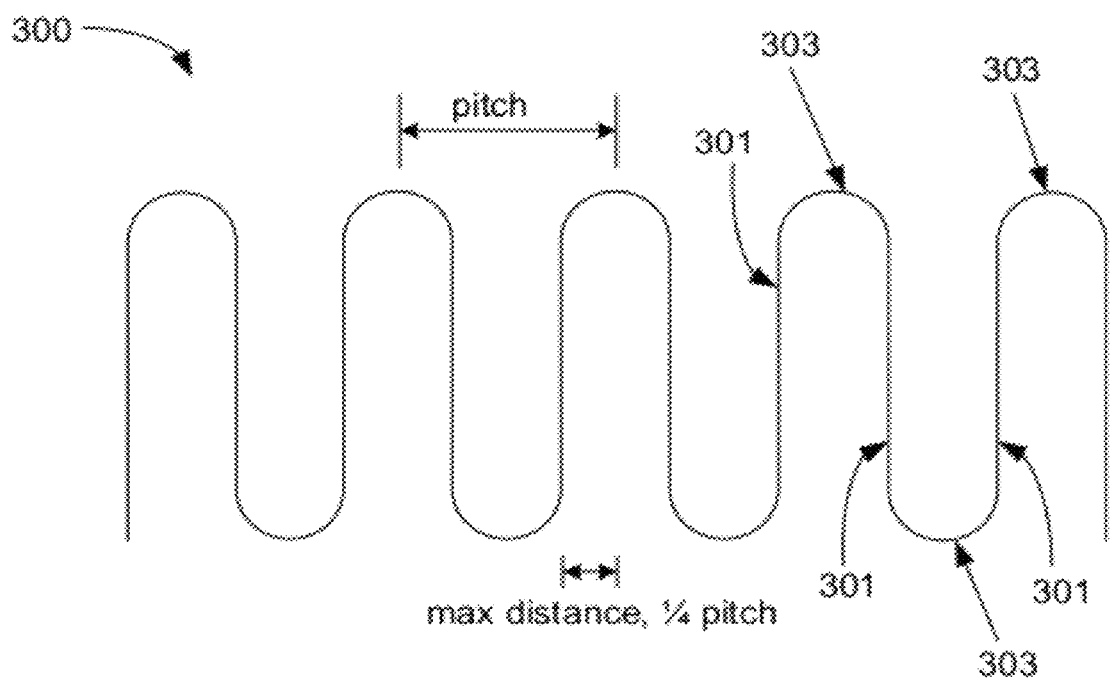
FIG. 3 is a schematic illustration of a section of a serpentine wire according to certain embodiments.

Wire 113 is significantly more conductive than the transparent top layer 107 and so improves current collection. FIG. 3 shows a section 300 of a serpentine wire according to embodiments of the invention. As used herein, the term "serpentine" refers to a form having substantially uniformly spaced, substantially co-extensive and substantially parallel lengths of wire connected via substantially rounded end portions. Uniformly spaced, co-extensive, parallel lengths 301 connected by rounded end portions 303 are indicated in FIG. 3. In other embodiments, the apparatuses and methods described herein may also be used to form wire current collectors having other configurations, e.g., such as angled zig-zag patterns, etc.

The pitch of the serpentine wire, as measured by the distance between the centers of adjacent end portions, determines the distance current travels through the transparent conducting oxide prior to reaching the highly conductive wire. As shown in FIG. 3, the maximum distance current has to travel through the transparent conductive oxide is ¼ pitch. Reducing the pitch increases current collection, however, it also decreases the useful surface area of the cell. In certain embodiments, the pitch is between about 4 and 10 mm, e.g., about 6.5 mm, though other distances may also be used as appropriate.

Figure 4:
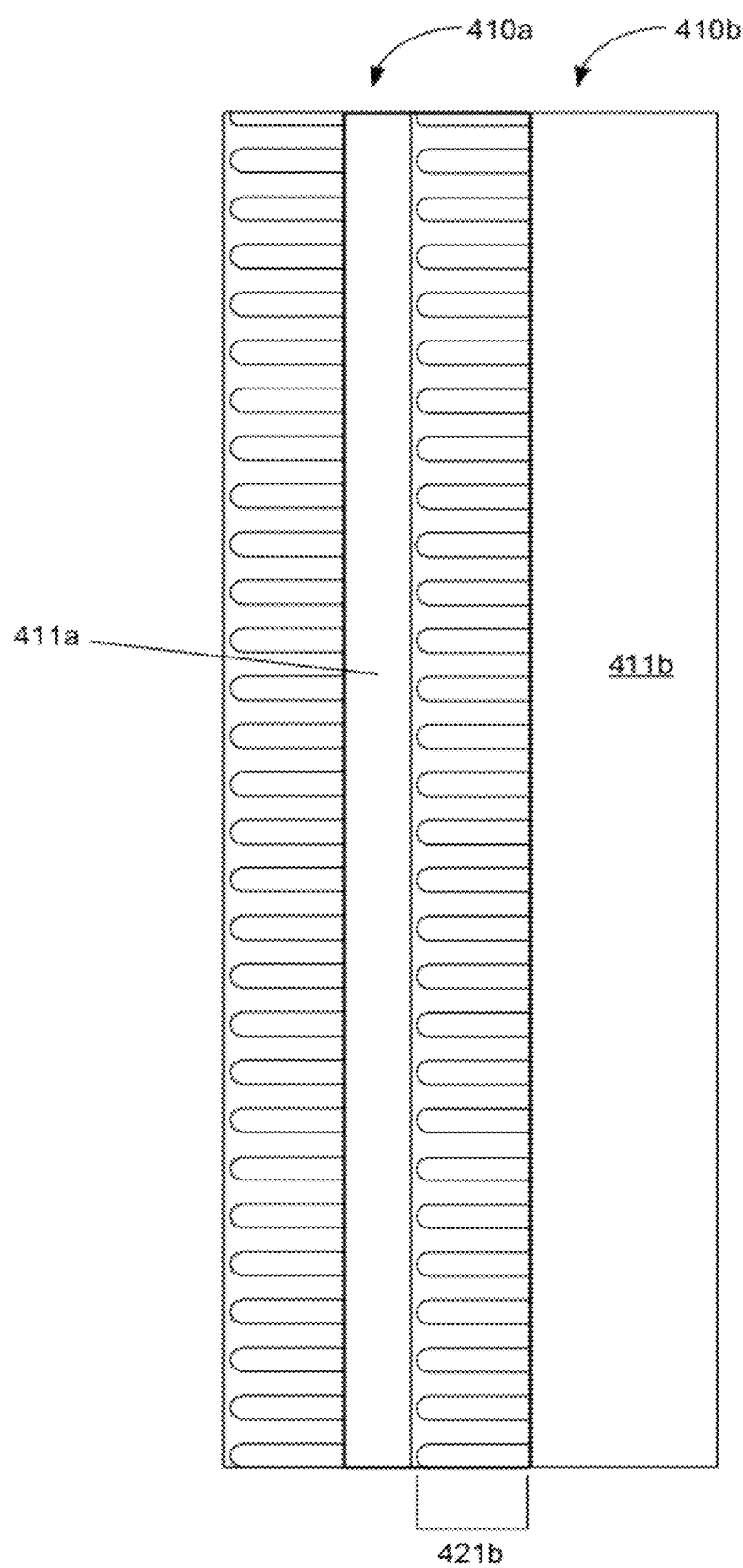
FIG. 4 depicts two interconnected solar cells according to certain embodiments.

Returning to FIG. 1, view 103 depicts metallic substrate 111 and interconnect portion 121 of serpentine wire 113. Back decal 117, which overlies portion 121 of serpentine wire 113 as shown in view 103, is an insulating carrier for serpentine wire 113. In view 103, the conductive side of interconnect portion 121 faces down, able to make contact with a metallic substrate of an adjacent cell. An example is depicted in FIG. 4, which shows the backsides of cells 410a and 410b including metallic substrates 411a and 411b. Wired interconnect 421b of cell 410b overlies metallic substrate 411a of cell 410a, thereby electrically connecting the cells 410a and 410b.

Figure 5:
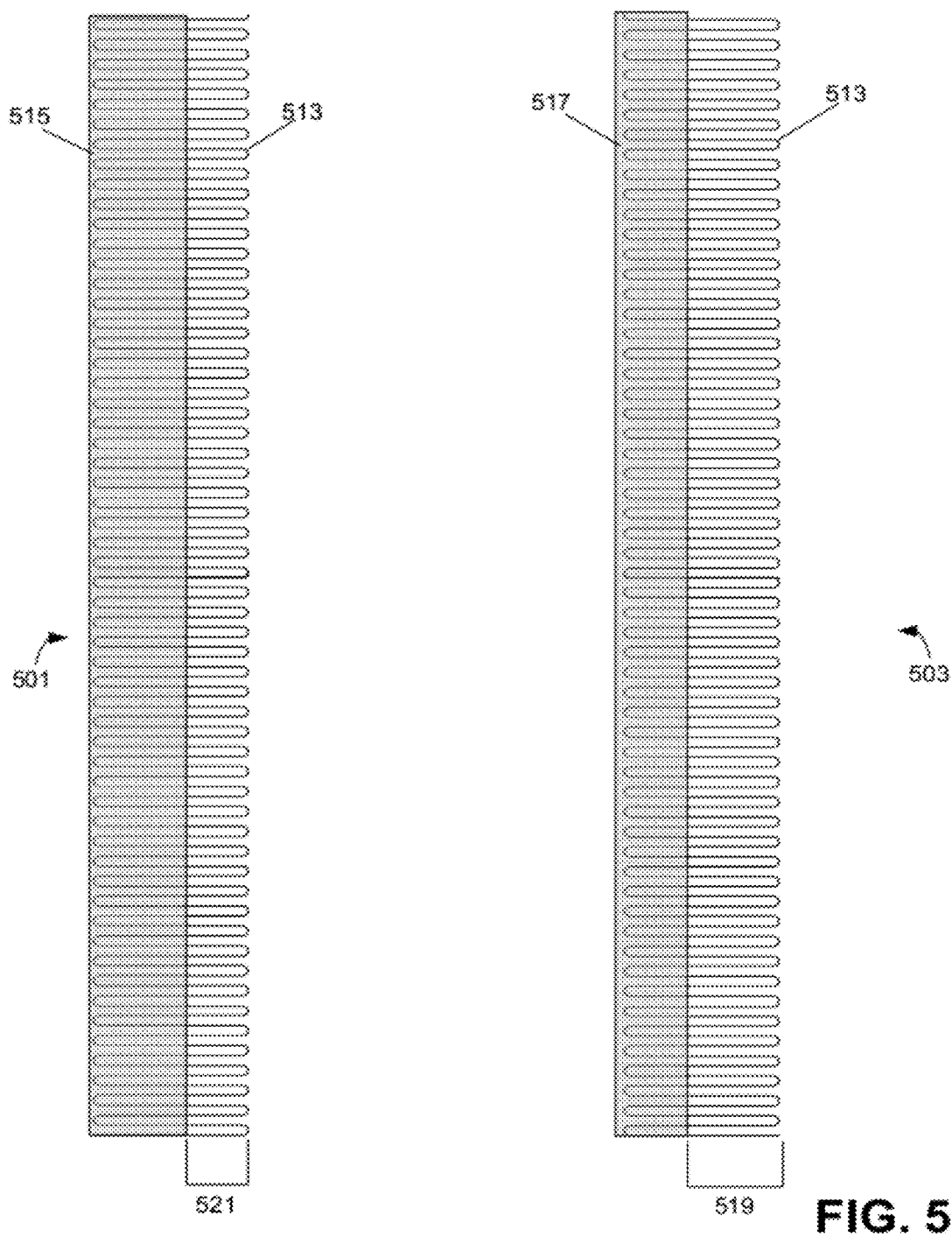
FIG. 5 depicts front and back views of a wire assembly according to certain embodiments.

In certain embodiments, the serpentine wire is provided on an insulating carrier, such as front and back decals described with reference to FIG. 1. FIG. 5 depicts front and back views of a strip of a wire assembly including serpentine wire 513 and front and back decals 515 and 517, respectively. Front view 501 shows serpentine wire 513 and front decal 515, which overlies a portion of wire 513. (Back decal 517 is not depicted in view 501 for clarity.) Exposed portion 521 of wire interconnects the cell as depicted in FIG. 4. Back view 503 shows serpentine wire 513 and back decal 517, which overlies a portion of wire 513. Exposed portion 519 of wire 513 faces the top conducting oxide and acts as a current collector. In certain embodiments, such a wire assembly is affixed to the front side of a cell or cell width strip (such as those shown in FIG. 2). In alternate embodiments, one or more of the decals do not overlie the rounded end portions of the serpentine wire.

Figure 6:
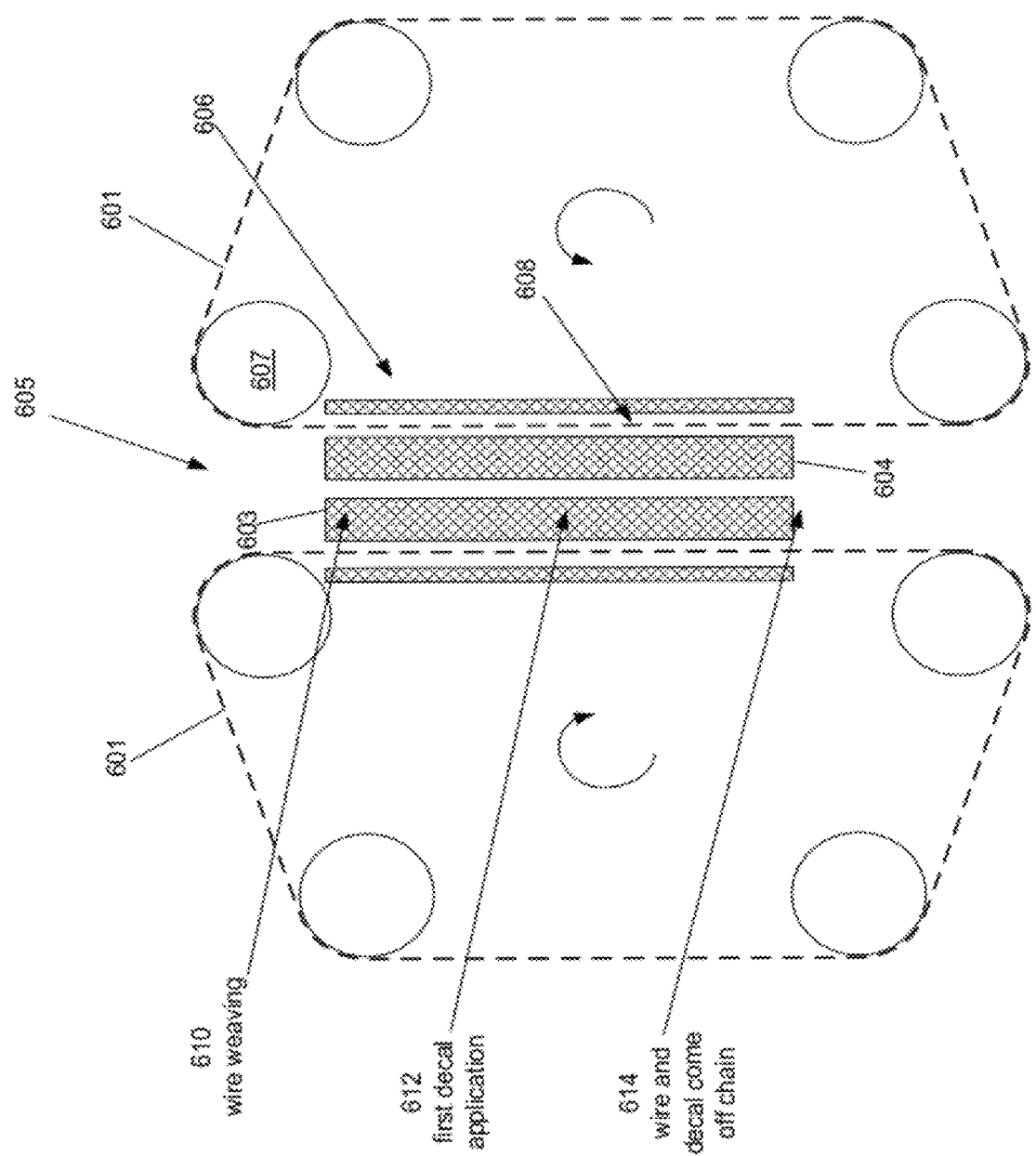
FIG. 6 is a simplified schematic diagram depicting certain components of an apparatus according to certain embodiments.

Embodiments of the invention provide apparatuses and methods of fabricating a wire assembly, including a serpentine wire and insulating carrier, such as that shown in FIG. 5. According to various embodiments, the apparatuses include re-circulating chain link assemblies having uniformly pitched posts and a wire weaving assembly configured to weave wire around the posts as they circulate. In certain embodiments, the re-circulating chain link assemblies are disposed on opposite sides of a linear channel, with linear segments of each re-circulating chain path lining the channel. After being formed, the serpentine wire travels in the channel, where one or more decals may be applied. FIG. 6 is a simplified schematic diagram depicting certain components of such an apparatus according to certain embodiments. Two chains 601 are disposed on opposite sides of a linear channel 605. A linear guide 606 having first and second ends 603 and 604, respectively, is disposed with linear channel 605. Linear guide 606 is a raised surface within the channel 605 and provides guide channels 608 for chains 601 to feed through. Sprockets 607 drive each chain through a path including a substantially linear segment aligning the channel 605. Each chain re-circulates over its path in a direction indicated by the arrows. Re-circulating chains 601 include links having vertically oriented posts (not shown) extending therefrom, around which a wire is woven to fabricate a serpentine wire. Once woven, the wire is guided via guide 606 through channel 605 before coming off the chain. According to various embodiments, at least one insulating carrier is applied to the serpentine wire prior to the wire coming off the chain. FIG. 6 indicates approximate locations of certain operations along the linear channel 605. First at a position 610 proximate to first end 603 of guide 606, a wire is woven around vertically oriented post members of the moving chains to form a serpentine wire as described above. After formation, the serpentine wire moves down the linear channel 605 engaged on the posts of the chains. A first decal is applied at 612. In embodiments in which front and back decals are used (such as shown in FIG. 5), either the front or back decal may be applied. The decal is typically applied to overlie the serpentine wire as it is guided down the channel. At a position 614, proximate to the other end 604 of the linear guide 606, the wire assembly, including the serpentine wire and decal carrier comes off the chains. In certain embodiments, a second decal is then applied to the serpentine wire, fabricating a wire assembly including front and back insulating carriers and serpentine wire as described above with respect to FIG. 5. The chains continue to circulate, picking up newly woven wire at position 610. In most embodiments, the chains and posts move at substantially constant rates.

Figure 7:
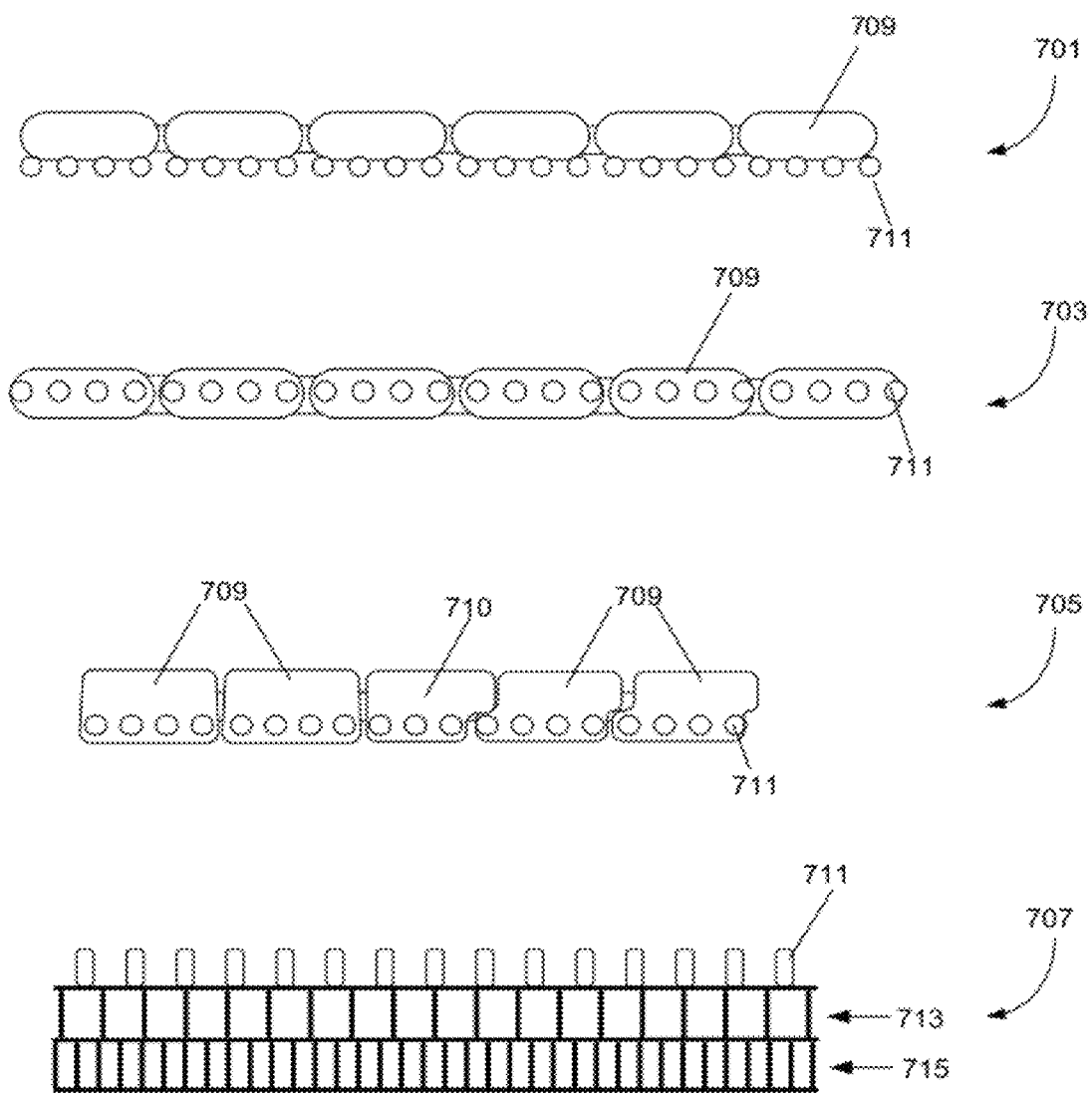
FIG. 7 depicts several views of link assemblies according to certain embodiments.

As indicated above, the re-circulating chains include vertically-oriented posts extending from the chain links, around which the wire is woven. The pitch of the posts is uniform and corresponds to the pitch of the serpentine wire. According to various embodiments, the posts may extend from the sides of the link bodies, extend from the top surface of the link bodies, etc. FIG. 7 provides examples of multi-link chain segments, including vertically-oriented posts. Top down view 701 shows an example of links 709 having uniformly spaced posts 711 extending from side surfaces of the links 709; and top down view 703 shows an example of links 709 with uniformly spaced posts 711 extending from the top surfaces of the links 709. The posts are uniformly spaced across the entire chain; in certain embodiments, the number of posts extending from each link may vary. An example is shown in view 705, in which links 709 have four posts and link 710 three posts. Link shape and size may vary as well to maintain uniform post spacing. In certain embodiments, the chain may include a first set of links that engage with the sprockets and a set of adapter links disposed on the first set of links. Side view 707 shows a set 713 of adapter links, including posts 711, disposed on a set 715 of links.

The vertically-oriented posts are uniformly sized and positioned with respect to the posts on the opposing chain to form the substantially parallel lengths and corresponding rounded end portions of the serpentine wire as depicted in FIG. 3. Post diameter corresponds to the end rounded region diameter of the serpentine wire. According to various embodiments, the post diameter ranges from about 2.5 mm to 4 mm though other post sizes may be used as appropriate. In certain embodiments in which a serpentine form is fabricated, post diameter sets the pitch.

Figure 8:
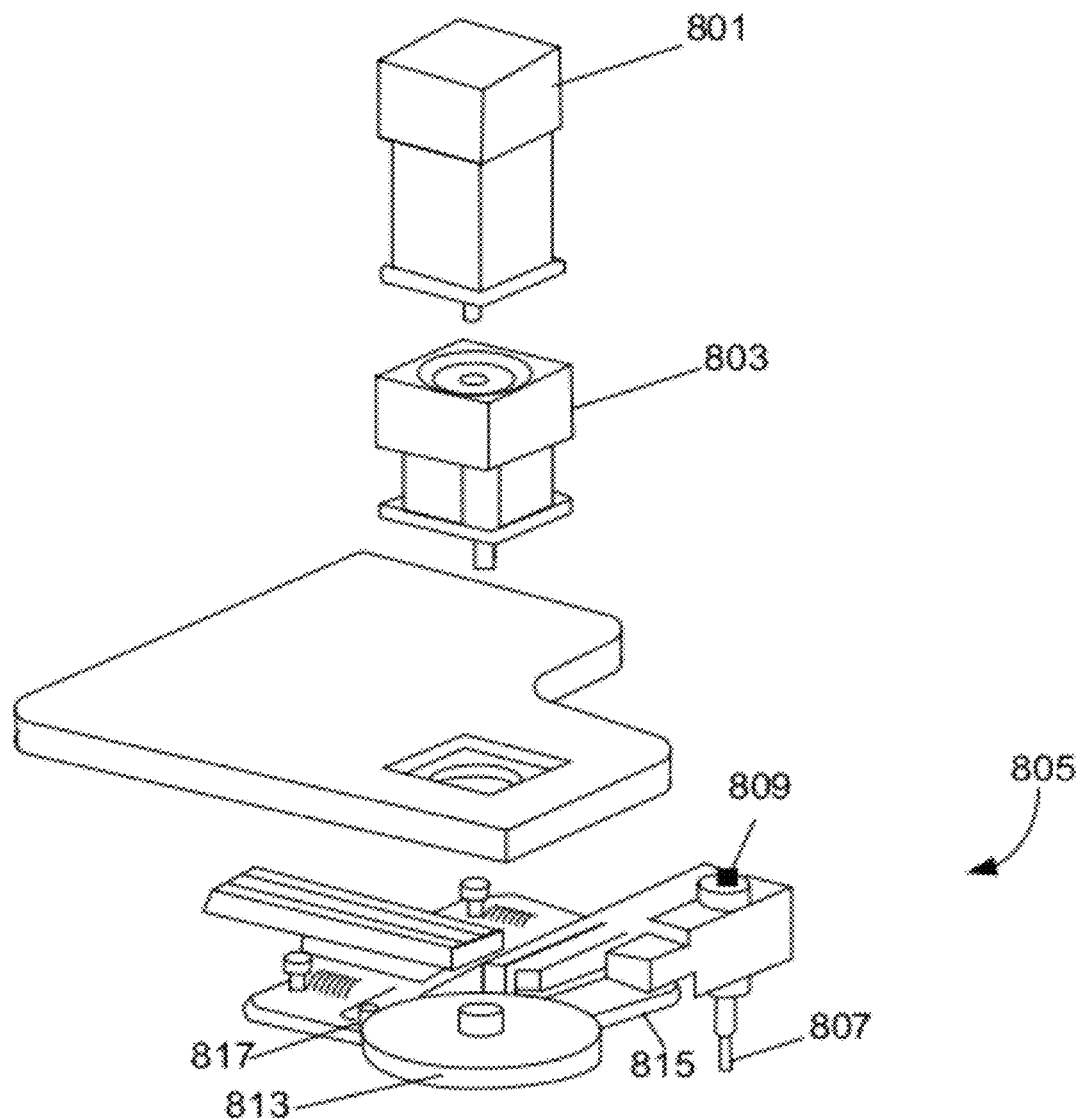
FIG. 8 depicts an exploded view of components of a wire weaving apparatus according to certain embodiments.

Wire is woven around posts of opposing chains as they re-circulate through their paths. FIG. 8 depicts an exploded view of components of a wire weaving apparatus according to certain embodiments, including motor 801, gear box 803 and weaving assembly 805. Weaving assembly 805 includes a tip 807, to which wire is fed via feed 809. Cam 813 imparts simultaneous side-to-side motion (across the linear channel) to tip 807 via crank 815, and back-and-forth motion (along the linear channel) via cam follower 817. Back-and-forth motion as described above is also referred herein to as axial motion (i.e., along the direction of the axis of the linear channel), with side-to-side motion referred to as transverse motion (i.e., across the linear channel). Further details of these and other components of the weaving apparatus are described below with reference to FIGS. 10A and 10B.

Figure 9:
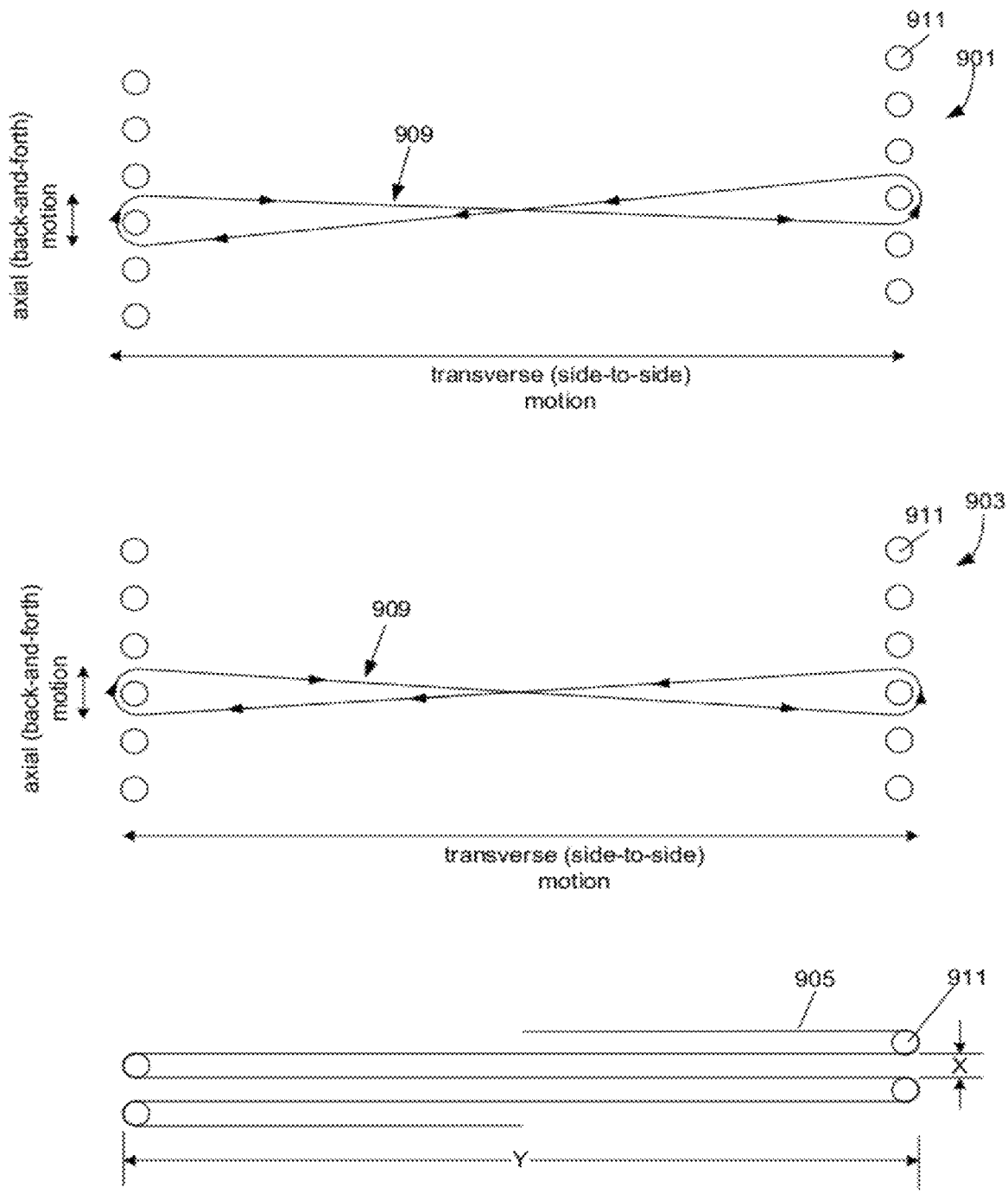
FIG. 9 depicts examples of elongated "figure 8" paths a tip of wire weaving apparatus follows according to certain embodiments.

In operation, wire is fed through the wire weaver tip, which weaves around the posts of opposite re-circulating chains to form the serpentine wire. In certain embodiments, the movement can be characterized as an elongated FIG. 8 motion. The exact form of the FIG. 8 motion may be varied on a number of factors, including the alignment of posts on opposite re-circulating chains, i.e., the degree to which posts on a re-circulating chain are aligned or staggered with respect to posts on the opposing chain; the pitch of the serpentine wire; and the speeds of the chains as they move past the weaving apparatus. FIG. 9 depicts two not-to-scale examples 901 and 903 of a repeating path 909 of a wire weaver tip through posts 911 of opposing re-circulating chains. (The movement of posts 911 along the linear channel is not shown in the figure.) Path 909 of view 903 is a symmetrical elongated FIG. 8, path 909 of view 901*a* slightly skewed FIG. 8. For the sake of illustration, the motion around the posts is exaggerated; in certain embodiments, the post clearances distances may be much tighter than depicted. According to various embodiments, the aspect ratio of the elongated FIG. 8 formed by the wire weaver is at least about 5:1; at least about 10:1; or at least about 15:1. In a particular embodiment with 3.25 mm diameter posts, the transverse distance is about 53 mm, for posts 50 mm apart, with the axial distance being on the order of about 3.25 mm. As described further below, the wire weaving apparatus is capable of weaving wire around the moving posts with tolerances of less than 1 or 0.1 mm. While the path may vary depending on the factors described above, however, the resulting wire dispensed by the tip is a serpentine form. FIG. 9 also depicts a segment 905 formed by two FIG. 8 cycles. The axial distance is shown as "X" and the transverse distance as "Y." In certain embodiments, X is about 3.25 mm and Y about 52.9 mm. As indicated, the actual distance traveled by the wire weaver may be slightly greater in certain embodiments to allow the wire tip to clear the posts.

Figure 10A:
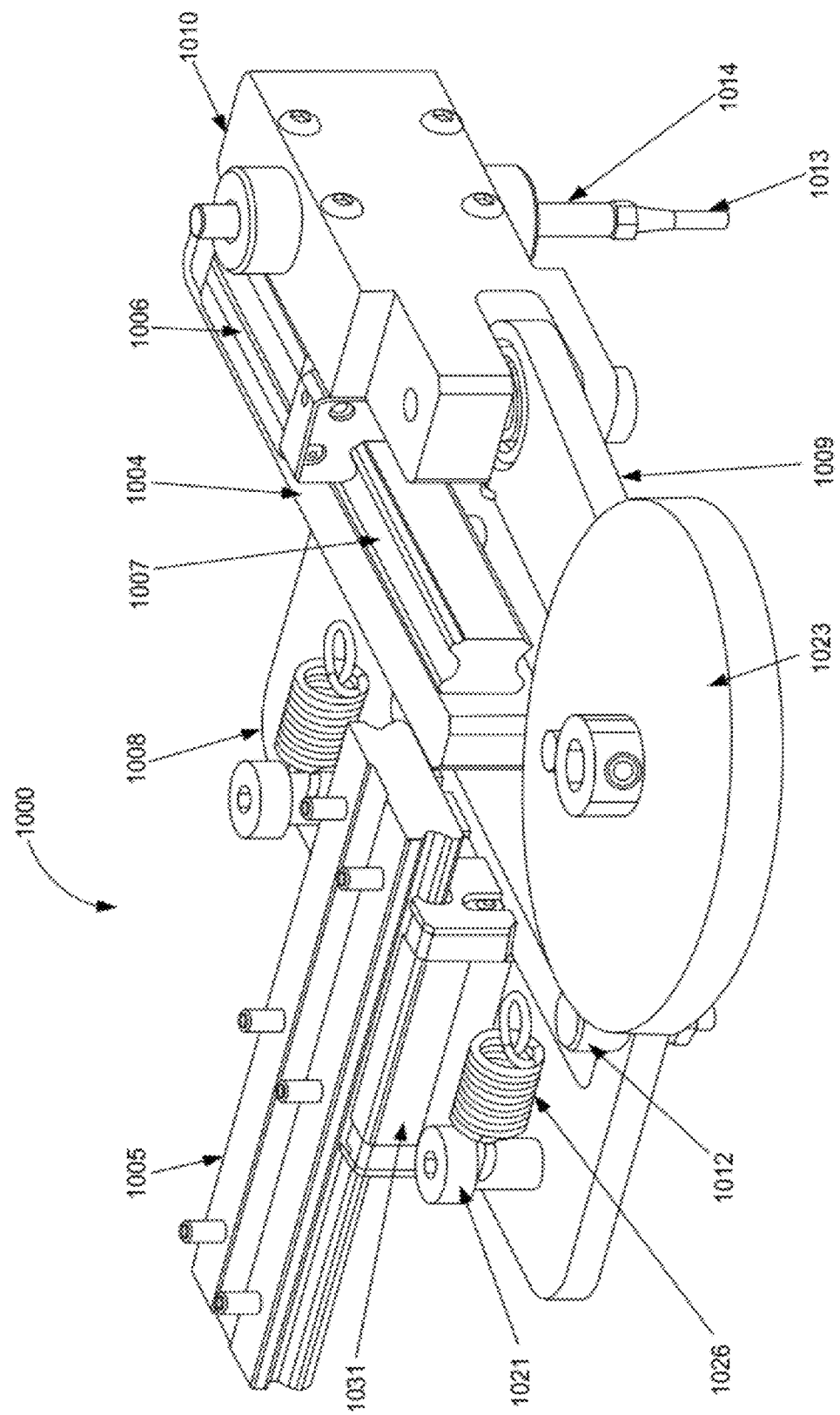
FIG. 10a depicts a perspective view of a wire weaving assembly according to certain embodiments.
Figure 10B:
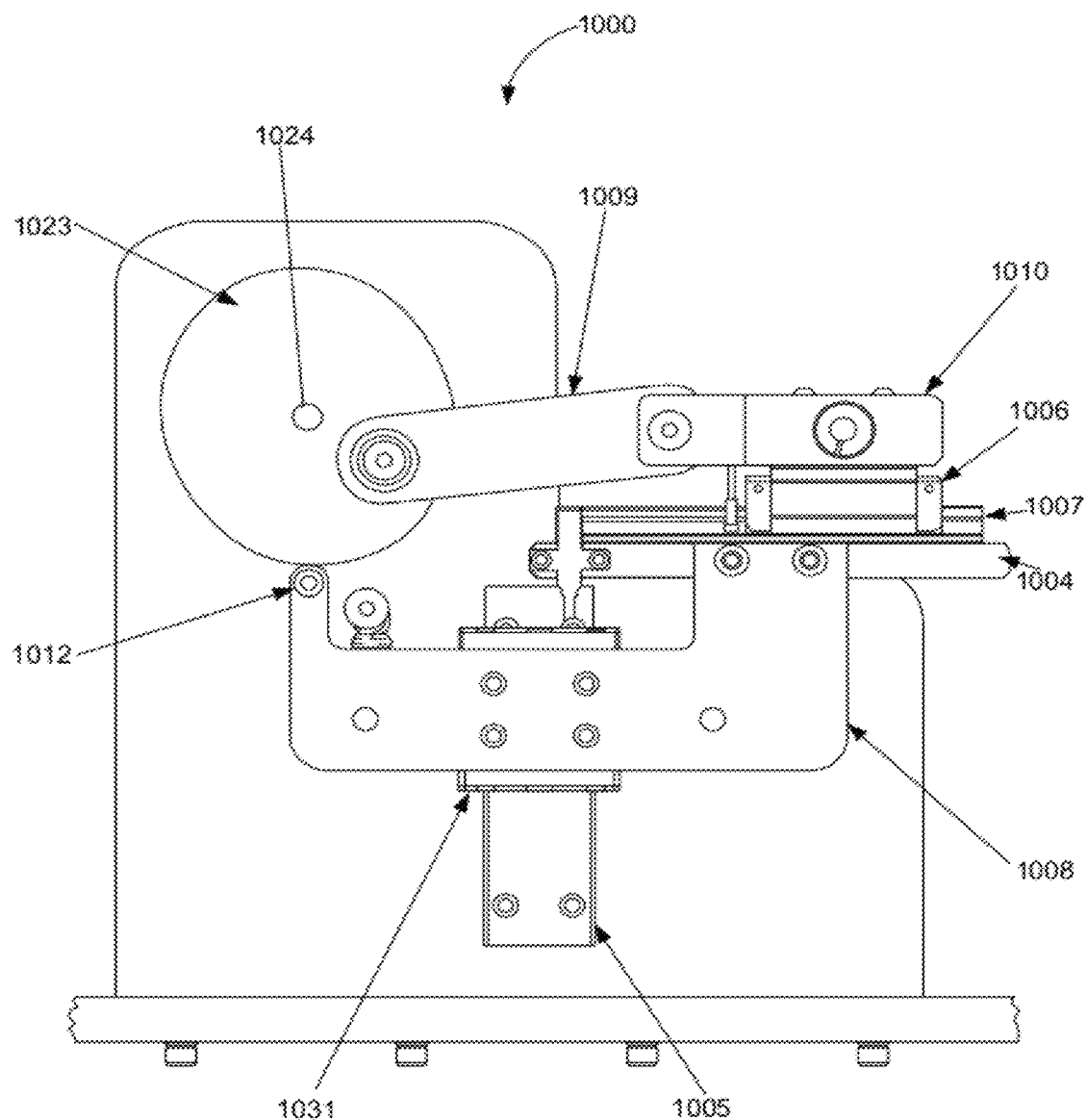
FIG. 10b depicts a bottom view of a wire weaving assembly according to certain embodiments.

FIG. 10A depicts a perspective view of weaving assembly 1000 and FIG. 10B a bottom view of weaving assembly 1000. Various components including tip 1013, tube 1014, pen mount block 1010, cam 1023, crank 1009, bearing 1006, transverse rail mount 1004, transverse rail 1007, cam follower 1012, spring mounts 1021, springs 1026, bearing 1031, axial rail 1005, and plate 1008 are depicted.

Figure 11:
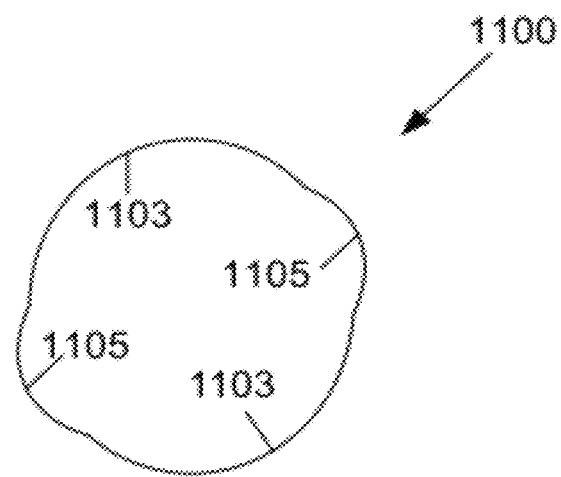
FIG. 11 depicts a simplified example of a cam shape according to certain embodiments.

In operation, a wire is fed to tip 1013 from a spool (not shown) via hollow tube 1014. The tip may be made of nylon in certain embodiments. Also in certain embodiments, prior to feeding the wire to the weaving assembly, a dancer roller or other wire tension control system as known in the art may be employed to control the tension of the wire as it is fed to tip 1013. Examples of dancer rollers are described in European Patent Publication 0114365 and U.S. Pat. Nos. 4,398,677 and 4,923,113. A motor (not shown) rotates cam 1023 via shaft 1024. Cam 1023 drives simultaneous transverse (side-to-side) and axial (back-and-forth) motions of pen mount block 1010, and tube 1013 and tip 1014 mounted on block 1010, to form an elongated FIG. 8 path described in FIG. 9. As cam 1023 rotates, crank 1009 drives transverse motion of pen mount block 1010. Bearing 1006 is mounted on pen mount block 1010 allowing block 1010 to slide along transverse rail 1007 mounted on mount 1004. During a single revolution of cam 1023, pen mount block 1010 slides side to side and back along rail 1010 one time. Also as the cam rotates, axial motion is imparted to plate 1008 and from plate 1008 to pen mount block 1010 via cam follower 1012. The axial motion is dictated by the circumferential shape of cam 1023, along which cam follower 1012 traces. Cam 1023 deviates from a circular shape, with the deviations controlling the axial motion of pen mount block 1010 and tip 1013. In certain embodiments, the required axial motion is relatively quick relative to the transverse motion as the tip 1013 goes around the outer edge of a post on one chain, and gradual as the tip traverses the desired width of the serpentine wire moving to a post on the opposite chain. In certain embodiments, cam 1023 is shaped to provide two quick axial motions and two gradual axial motions during a single rotation. In operation, as cam 1023 rotates, cam follower 1012 mounted on plate 1008 follows the edge of cam 1023. Protruding deviations along the cam edge (as compared to an ideal circle) push cam follower 1012 and plate 1008 away from the center of the cam 1023. Bearing 1031 is mounted on plate 1008, allowing plate 1008 to slide back along axial rail 1005. Tip 1013 moves around a post. Springs 1026 then return the plate 1008 and cam follower 1012, allowing cam follower 1012 to continue tracing cam 1023. In certain embodiments, cam 1023 has a continuously varying radius of curvature to provide continuous axial motion. To go around posts, in certain embodiments, the edge of cam 1023 has two opposing rapid changes in curvature radius, separated by segments having gradual changes in curvature radius. In certain embodiments; cam 1023 is an irregular oval shape. A simplified and exaggerated example is shown in FIG. 11, which depicts an oval cam edge 1100 having irregular segments 1105 each with a rapid change in radius and that are separated by segments 1103 each having a gradual change in radius. While the cam shape is described generally here, one of skill in the art will understand that the precise shape may be irregular and vary depending on a number of factors including desired wire dispensing tip path, spring tension, etc. Driving the transverse and axial motions of the tip 1013 as described above, one revolution of cam 1023 results in one FIG. 8 motion of the tip 1023.

Figure 12:
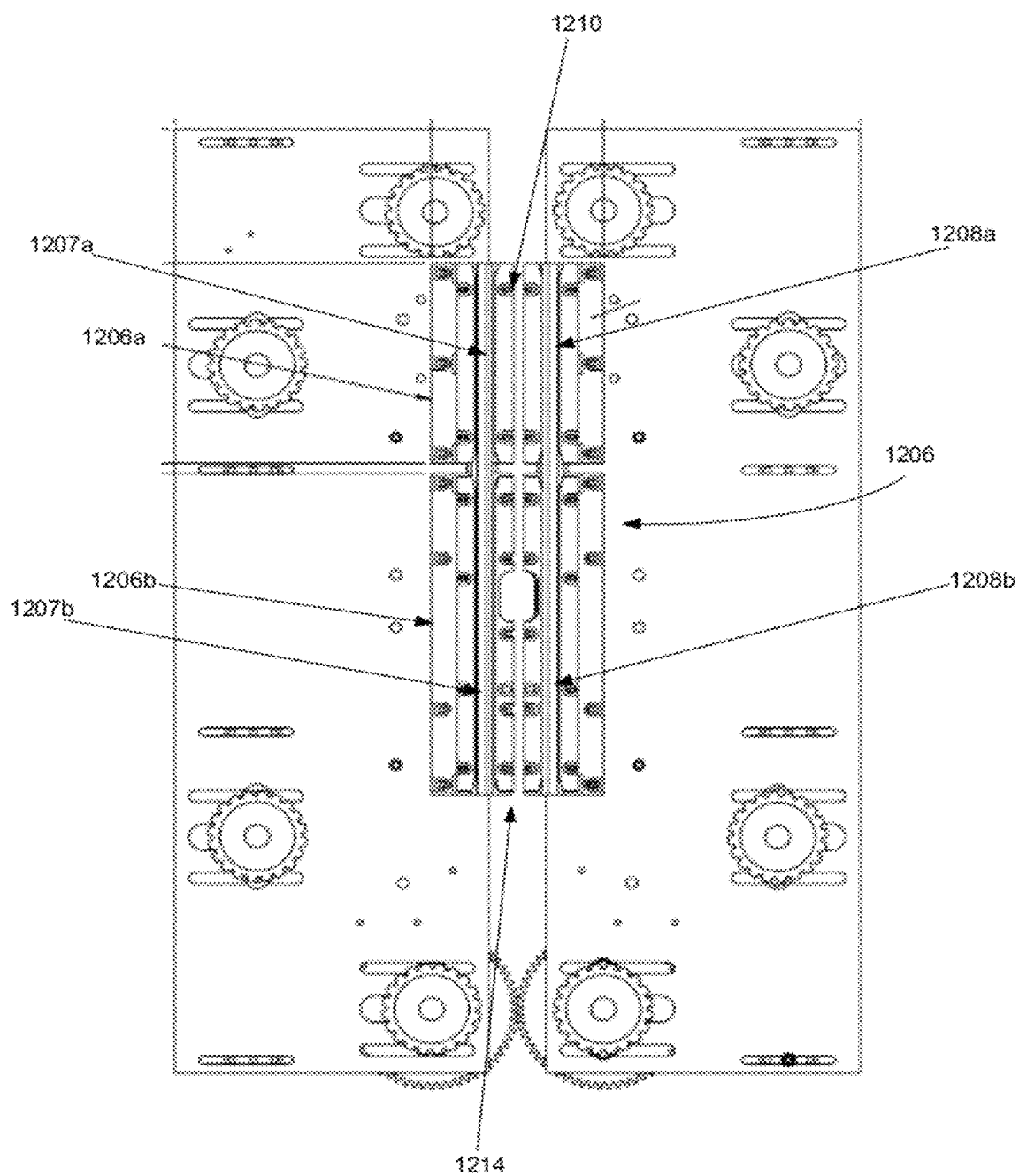
FIG. 12 depicts a top view of a linear guide configured to increase wire tension according to certain embodiments.

Once woven, the serpentine wire travels down the linear channel engaged on posts of opposing re-circulating chains. In certain embodiments, the distance between posts of opposing chains increases as the serpentine wire travels down the channel to increase wire tension. FIG. 12 depicts a linear guide 1206 divided into two segments 1206a and 1206b. Segment 1206a includes left guide channel 1207a and right guide channel 1208a to guide opposing chains (not shown); segment 1206b includes left guide channel 1207b and right guide channel 1208b to guide opposing chains. As described above, wire is wound around posts of opposing chains at an approximate position 1210 to form the serpentine wire, which then travels down the linear channel on links of opposing chains to a position 1214 where it comes off the links. The distance between left channel 1207b and right channel 1208b of guide segment 1206b is slightly greater than that between left channel 1207a and right channel 1208a of guide segment 1206a, so that as opposing links enter guide segment 1206b from segment 1206a, the tension on the wire from the link posts increases. In one example, the guide segments are configured such that distance between opposing posts is 52 mm in segment 1206a and 53 mm in segment 1206b. FIG. 12 presents an example of a linear guide configured such that the distance between posts narrows; in other embodiments, three or more segments may be used or the channels may angle slightly to achieve narrowing.

Figure 13:
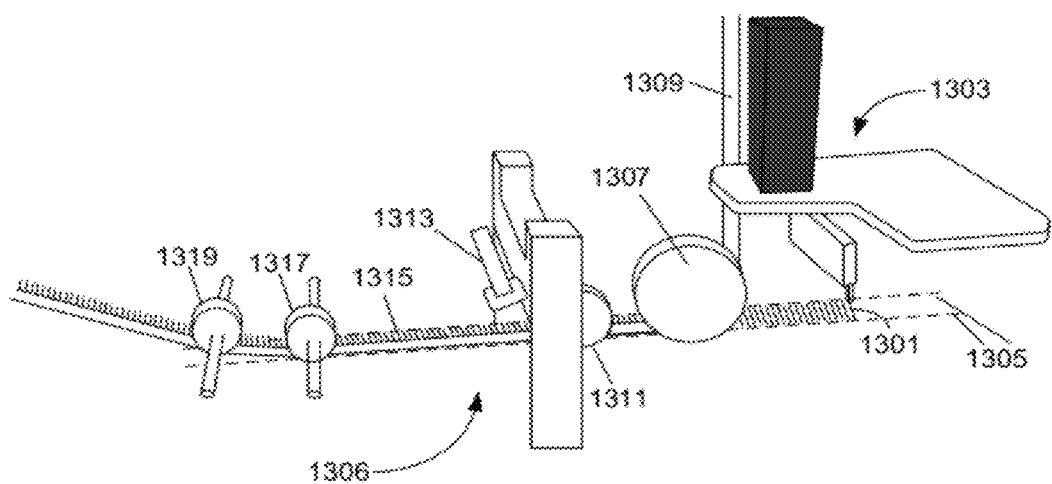
FIG. 13 illustrates decal application according to certain embodiments.

As described above, with reference to FIG. 6, in certain embodiments, a decal is applied to the one side of the serpentine wire prior to the formed wire coming off the links of the re-circulating chains. FIG. 13 shows a schematic illustrating decal application according to certain embodiments. Serpentine wire 1301 is formed by weaving assembly 1303 as described above. For clarity, rounded end portions of serpentine wire 1301 are not shown. Opposing chains are represented at 1305, with individual links and posts not shown. After formation, serpentine wire travels down linear channel 1306 supported by moving chains 1305. Rotating decal guide 1307 lays thermoplastic decal strip 1309 from a spool (not shown) over serpentine wire 1301. In the depicted embodiment, decal strip 1309 does not overlie rounded end portions of serpentine wire 1301, though in other embodiments it may. Roller 1311 presses decal strip 1309 into serpentine wire as hot air jet (not shown) below the decal and wire heats the decal material, melting the thermoplastic thereby adhering decal strip 1309 to serpentine wire 1301. Sensor 1313 measures the temperature to ensure proper adhesion. Wire assembly 1315, including decal strip 1309 and serpentine wire 1301 continue along linear channel 1306, until pulled off chains 1305 by rollers (not shown). Rollers 1317 and 1319 are positioned above the linear channel to modulate the angle at which the wire assembly 1315 is pulled off chains 1305, allowing the wire assembly 1315 to come off chains 1305 gradually and without risking breakage.

Figure 14:
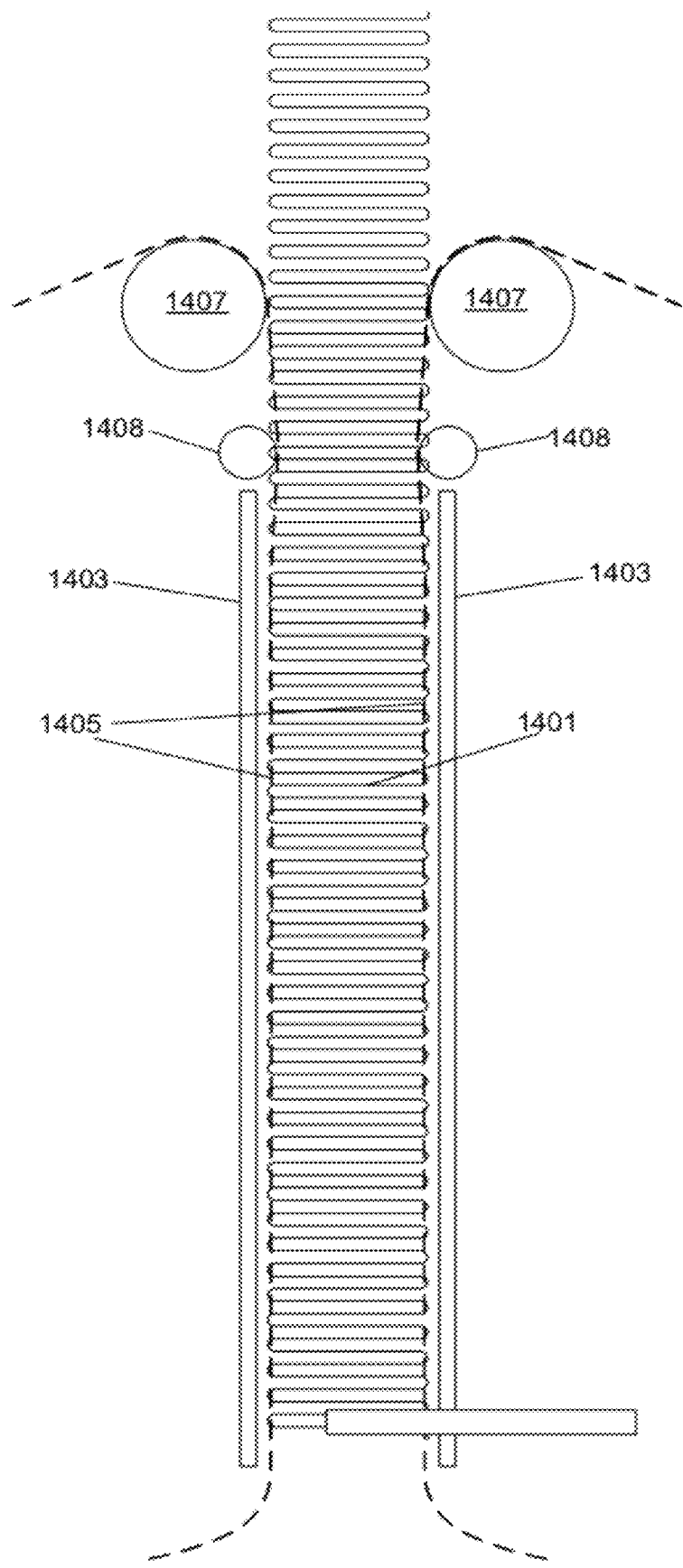
FIG. 14 illustrates release of a serpentine wire from re-circulating chains according to certain embodiments.

In certain embodiments, the posts of the links are angled inwards to facilitate release off the serpentine wire and decal. FIG. 14 depicts an example in which wire 1401 rides on chains 1405 through linear guide 1403. (Chains are represented as 1405; for clarity, individual links and posts are not depicted. Each rounded end portion of serpentine wire 1401 is wrapped around a post of a chain 1405. Also for clarity, center portion of guide 1403 and a decal are not depicted.) Two cylindrical members 1408 are disposed at the end of linear guide 1403 on both sides of guide 1403. As the links of the chains pass members 1408, the links are angled inward away from the end portions of the formed serpentine wire 1401. The serpentine wire 1401 is then free to be lifted off the chains 1405 for further processing, while chains 1405 continue re-circulating as driven by sprockets 1407.

After exiting the weaving apparatus as described above, a bottom decal may be applied in certain embodiments. FIG. 15 provides a schematic depiction of an apparatus configured for bottom decal application. Wire assembly 1501 including a serpentine wire and a top decal is depicted after release from the re-circulating posts as described in FIGS. 13 and 14. Rollers 1503, 1505 and 1507 drive wire assembly 1501 towards hot lamination rollers 1513. In this embodiment, multiple rollers 1503, 1505 and 1507 are used to control wire assembly tension. As wire assembly 1501 approaches hot lamination rollers 1513, bottom decal 1509 is fed from a spool (not shown) to underlie wire assembly 1501, positioned appropriately. The wire assembly 1501 and bottom decal 1509 travel together between hot lamination rollers 1513. The decals are heated to a temperature of about 165° C. (+/−15° C.) and pressed together, forming wire and dual decal assembly 1511. At this point, the wire assembly may be complete and ready to be applied to solar cell thin films as described above.

Although the foregoing invention has been described in some detail for purposes of clarity of understanding, it will be apparent that certain changes and modifications may be practiced within the scope of the invention. For example, in certain embodiments, a non-serpentine uniformly-pitched wire may be fabricated by appropriately adjusting the spacing and diameters of the posts. In this manner, for example, a wire having non-parallel segments connected by rounded ends may be formed. It should be noted that there are many alternative ways of implementing both the processes and apparatuses of the present invention. Accordingly, the present embodiments are to be considered as illustrative and not restrictive, and the invention is not to be limited to the details given herein.

What is claimed is:

1. An apparatus for forming a serpentine current collector for a solar cell, said apparatus comprising:
    a linear channel;
    first and second chain paths, each including a linear segment disposed along the linear channel on opposite sides of the linear channel;

first and second re-circulating chains configured to re-circulate along the first and second chain paths, respectively, and comprising links having vertically oriented uniformly pitched posts extending therefrom; and a wire weaver disposed proximate to a first end of the linear channel configured for simultaneous motion perpendicular to and parallel to said linear channel.

2. The apparatus of claim 1 comprising a linear guide disposed within the linear channel, said guide including first and second linear guide channels.

3. The apparatus of claim 2 wherein the linear segment of the first chain path is within the first linear guide channel and the linear segment of the second chain path is within the second linear guide channel.

4. The apparatus of claim 1 wherein the wire weaver comprises a nylon tip configured to dispense wire.

5. The apparatus of claim 1 wherein the wire weaver comprises a cam having a continuously variable radius of curvature.

6. The apparatus of claim 1 wherein the wire weaver comprises a tip configured to dispense wire and a cam configured to provide motion to said tip such that the tip dispenses wire in an elongated FIG. 8 path.

7. The apparatus of claim 6 wherein the first and second re-circulating chains having posts extending therefrom and the wire weaver tip are configured to move independently such that the FIG. 8 motion of the wire weaver winds wire around the outer edge of each post as the chains re-circulate.

8. The apparatus of claim 7 wherein the wire is wound in a serpentine form.

9. The apparatus of claim 6 wherein the cam imparts motion to the tip perpendicular to the direction of the linear channel via a crank and imparts motion to the tip parallel to the direction of the linear channel via a cam follower.

10. The apparatus of claim 1 further comprising a first decal applicator located along the linear channel.

11. The apparatus of claim 1 further comprising vertical members disposed on opposite sides of the linear channel adjacent to the linear segments and configured to narrow the distance between first and second chain paths.

12. A method of forming a serpentine current collector for a solar cell comprising:

recirculating a first chain comprising links having vertically oriented uniformly pitched posts extending therefrom over a first recirculation path;

recirculating a second chain comprising links having vertically oriented uniformly pitched posts extending therefrom over a second recirculation path;

wherein first and second recirculation paths are disposed on opposite sides of a linear channel and each include a linear segment disposed along the linear channel;

feeding wire through a wire weaver comprising a tip; and moving the wire weaver tip in an elongated figure 8 motion around the posts of the recirculating first and second chains to dispense the wire around the posts in a serpentine form.

13. The method of claim 12 further comprising rotating a cam to impart motion to the wire weaver tip perpendicular to the direction of the linear channel via a crank and impart motion to the wire weaver tip parallel to the direction of the linear channel via a cam follower.

14. The method of claim 12 further comprising applying an insulating carrier to the serpentine form while the serpentine form travels down the linear channel.

15. The method of claim 12 further comprising increasing tension on the serpentine form as it travels down the linear channel.

16. The method of claim 12 further comprising removing the serpentine form from the recirculating chains.

* * * * *